United States Patent
Kim et al.

(10) Patent No.: US 11,810,853 B2
(45) Date of Patent: Nov. 7, 2023

(54) TOP ELECTRODE INTERCONNECT STRUCTURES

(71) Applicant: GLOBALFOUNDRIES U.S. Inc., Malta, NY (US)

(72) Inventors: Il Goo Kim, Clifton Park, NY (US); Roderick A. Augur, Saratoga Springs, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/702,255

(22) Filed: Mar. 23, 2022

(65) Prior Publication Data

US 2022/0216148 A1 Jul. 7, 2022

Related U.S. Application Data

(63) Continuation of application No. 16/197,646, filed on Nov. 21, 2018, now Pat. No. 11,315,870.

(51) Int. Cl.
  *H01L 23/522* (2006.01)
  *H01L 21/768* (2006.01)
  *H10B 61/00* (2023.01)
  *H10B 63/00* (2023.01)

(52) U.S. Cl.
  CPC .... *H01L 23/5226* (2013.01); *H01L 21/76897* (2013.01); *H10B 61/00* (2023.02); *H10B 63/84* (2023.02)

(58) Field of Classification Search
  None
  See application file for complete search history.

(56) References Cited

U.S. PATENT DOCUMENTS

| 7,009,266 | B2 | 3/2006 | Shi et al. |
| 7,560,337 | B2 | 7/2009 | Ho et al. |
| 8,143,612 | B2 | 3/2012 | Lung et al. |
| 8,963,114 | B2 | 2/2015 | Liao et al. |
| 9,922,929 | B1 | 3/2018 | Zhang et al. |
| 2005/0090111 | A1 | 4/2005 | Lee |
| 2008/0217710 | A1 | 9/2008 | Homg |

(Continued)

FOREIGN PATENT DOCUMENTS

| CN | 106159083 | 11/2016 |
| CN | 106206449 | 12/2016 |
| WO | 2018182649 | 10/2018 |

OTHER PUBLICATIONS

Oh et al., "Full Integration of Highly Manufacturable 512Mb PRAM based on 90nm Technology", IEDM, 2006, 4 pages.

(Continued)

*Primary Examiner* — Vincent Wall
(74) *Attorney, Agent, or Firm* — Anthony Canale; Andrew M. Calderon; Calderon Safran & Cole P.C.

(57) ABSTRACT

The present disclosure relates to semiconductor structures and, more particularly, to top electrode interconnect structures and methods of manufacture. The structure includes: a lower metallization feature; an upper metallization feature; a bottom electrode in direct contact with the lower metallization feature; one or more switching materials over the bottom electrode; a top electrode over the one or more switching materials; and a self-aligned via interconnection in contact with the top electrode and the upper metallization feature.

14 Claims, 6 Drawing Sheets

(56) References Cited

U.S. PATENT DOCUMENTS

| | | |
|---|---|---|
| 2010/0221848 A1 | 9/2010 | Keshtbod |
| 2012/0086089 A1 | 4/2012 | Li |
| 2013/0001717 A1 | 1/2013 | Zhou |
| 2014/0042567 A1 | 2/2014 | Jung et al. |
| 2015/0287910 A1 | 10/2015 | Park et al. |
| 2016/0056235 A1 | 2/2016 | Lee et al. |
| 2016/0380183 A1 | 12/2016 | Chuang |
| 2020/0127194 A1* | 4/2020 | Rizzolo ................. H10N 50/10 |

OTHER PUBLICATIONS

Hisieh et al., "Ultra high density 3D via RRAM in pure 28nm CMOS process", IEEE, 2013, 4 pages.
Taiwanese Office Action in related TW Application No. 108137702, dated Jul. 13, 2020, 8 pages.
Taiwanese Office Action in related TW Application No. 108137702, dated Feb. 1, 2021, 8 pages.
Taiwanese Notice of Allowance in related TW Application No. 108137702, dated Aug. 3, 2021, 4 pages.
Chinese Office Action in related CN Application No. 201910998482.7, dated Jan. 30, 2023, 14 pages.
GermanOffice Action in related DE Application No. 10 2019 217 879.0 dated May 15, 2023, 7 pages.

\* cited by examiner

TOP ELECTRODE INTERCONNECT STRUCTURES

FIELD OF THE INVENTION

The present disclosure relates to semiconductor structures and, more particularly, to memory embedded in interconnect structures of integrated circuits (ICs), and methods of manufacture.

BACKGROUND

There are many challenges in current methods of forming an interconnection for a top electrode in embedded memory devices such as RRAM (Resistive RAM), PRAM (Phase-change RAM), MRAM (Magnetic RAM), FRAM (Ferro-electric RAM), etc. These memory devices include a bottom metallization and a top metallization, with a top electrode, switching material(s) and a bottom electrode between these metal layers.

For example, a challenge exists when forming the top electrode interconnection during the damascene line etch to reveal the top electrode. In this subtractive method, a narrow process window exists for the etch subtraction process. If the etch is too shallow, the connection has a high resistance. If the etch is too deep, there is a risk of shorting to the switching layer. To address these issues, the top electrode is often made thicker which, in turn, drives the needs for an extra overlay mask if the top electrode material is too thick to be optically transparent.

There are also challenges encountered during the top electrode interconnection fabrication processes if a via hole patterning process is used (instead of the line). In this type of process the via may land on the top electrode well before non-memory vias have landed on the metal level below. In this case, there is a high loss in the top electrode during the etch process. So a thicker top electrode is used, which drives the same issues as noted above. This type of top electrode interconnection is also limited by scaling, since the height of the memory bits must be much less than a single via height.

SUMMARY

In an aspect of the disclosure, a structure comprises: a lower metallization feature; an upper metallization feature; a bottom electrode in direct contact with the lower metallization feature; one or more switching materials over the bottom electrode; a top electrode over the one or more switching materials; and a self-aligned via interconnection in contact with the top electrode and the upper metallization feature.

In an aspect of the disclosure, a structure, comprises: a memory device comprising: a first metallization layer; a second metallization layer; and a vertical pillar connecting the first metallization layer to the second metallization layer, the vertical pillar including a self-aligned via interconnection in contact with a top electrode of the vertical pillar and the second metallization layer; and a periphery device or logic device comprising the lower metallization feature and the upper metallization feature connected together by an interconnect structure devoid of the self-aligned via interconnection and the vertical pillar.

In an aspect of the disclosure, a method comprises: forming a vertical pillar comprising a bottom electrode, one or more switching material, a top electrode and a masking material on the top electrode; forming an interlevel dielectric material over the vertical pillar; opening the interlevel dielectric material to expose the masking material; selectively removing the masking material over the top electrode to form a self-aligned via; forming an interconnection by deposited conductive material in the self-aligned via interconnect, which contacts the top electrode; and forming a metallization on the conductive material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
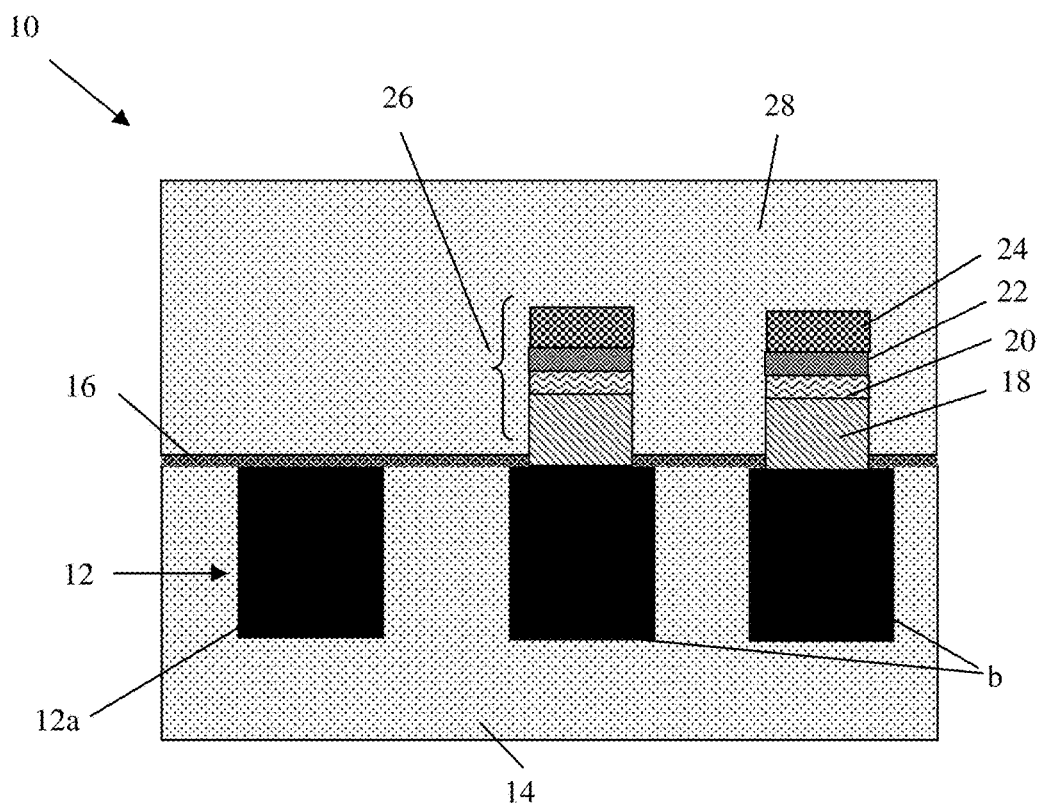
FIG. 1 shows a top electrode, switching material and a bottom electrode, amongst other features, and respective fabrication processes in accordance with aspects of the present disclosure.

The present disclosure relates to semiconductor structures and, more particularly, to top electrode interconnect structures and methods of manufacture. More specifically, the present disclosure provides robust interconnect structures to wire top electrodes of memory devices embedded in metal layers and methods of manufacture. The top electrode interconnect structure can be implemented in memory devices such as RRAM, PRAM and MRAM, as illustrative non-limiting examples.

Advantageously, the present disclosure provides a means to scale down the thickness of top electrode materials, with lower resistance of the top electrode for interconnection to upper wiring layers. In addition, the present disclosure provides a wider etch process window for the upper metal connection to the top electrode, with a lower cost compared to a double via patterning process. The processes described herein also provide for a self-forming via for the top electrode interconnect structure. In addition, there is little to no defectivity such as non-volatile hard polymer for via patterning. Moreover, implementing the structures and methods disclosed herein provides the freedom to remove hardmasks, e.g., TiN, used for dual damascene patterning with top electrode metals protected during wet etch or clean processes.

In embodiments, the top electrode is part of an interconnect structure between lower and upper metal structures. The interconnect structure comprises, for example, an upper metal interconnected to pillar features of a top electrode using a self-forming via patterning process. The interconnect structure to the top electrodes can be formed without a via photomask, thereby saving considerable costs. In further embodiments, the top electrode self-forming via is originated and generated from sacrificial hard mask materials on top of the top electrode, which is/are already used for top electrode lithography and etch patterning processes. In embodiments, the hard mask materials can be left after formation of the top electrode/switching materials/bottom electrode, and then selectively removed by dry or wet etch processes revealed during patterning processes for the interconnect structures to the upper metal layer (e.g., after deposition and planarization processes of the interlevel dielectric material). The self-forming via includes various types of features with dielectric liners or spacers, as examples.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

FIG. 1 shows a top electrode, switching material and a bottom electrode, amongst other features, and respective fabrication processes in accordance with aspects of the present disclosure. More specifically, the structure 10 of FIG. 1 includes a lower metallization feature 12, e.g., conductive wiring structures, embedded within an insulator material 14. In embodiments, the conductive wiring structures 12 can include conductive wiring structures 12a for logic or periphery devices and conductive wiring structures 12b for memory bit cell arrays. The conductive wiring structures 12a, 12b can be formed from any conventionally used metal or metal alloy materials. For example, the conductive wiring structures 12a, 12b can be copper. The insulator material 14 can be an oxide based material, as an example. In embodiments, the insulator material 14 can be, e.g., $SiO_2$, TEOS, FTEOS, low-k or ultra-low k SiCOH, etc.

In embodiments, the conductive wiring structures 12a, 12b are formed by conventional lithography, etching and deposition methods known to those of skill in the art. For example, a resist formed over the insulator material 14 is exposed to energy (light) to form a pattern (opening). An etching process with a selective chemistry, e.g., reactive ion etching (RIE), will be used to form one or more trenches in the insulator material 14 through the openings of the resist. The resist can then be removed by a conventional oxygen ashing process or other known stripants. Following the resist removal, the conductive material can be deposited by any conventional deposition processes, e.g., chemical vapor deposition (CVD) processes. Any residual material on the surface of the insulator material 14 can be removed by conventional chemical mechanical polishing (CMP) processes.

Still referring to FIG. 1, following the formation of the conductive wiring structures 12, an etch stop layer or diffusion barrier layer 16 can be deposited on the surface of the insulator material 14, over the conductive wiring structures 12. The etch stop layer or diffusion barrier layer 16 can be, e.g., nitrides such as SiCN, SiN, AlN, etc. An opening is formed in the etch stop layer or diffusion barrier layer 16 to expose a surface of the conductive wiring structures 12b.

A bottom electrode material 18, switching material(s) 20, a top electrode material 22 and hardmask material 24 are sequentially deposited over the etch stop layer or diffusion barrier layer 16. In embodiments, the deposition of these materials can be by any conventional deposition process including, e.g., physical vapor deposition (PVD), chemical vapor deposition (CVD) plasma enhanced CVD (PECVD) processes, atomic layer deposition (ALD), etc. The bottom electrode material 18 is in direct electrical contact with the conductive wiring structures 12b.

The materials 18, 20, 22 can be for example, TiN, TaN, WN, Al, Ru, Ir, Pt, Ag, Au, Co, W, Cu or a combination of multi-layer conducting films. The hardmask material 24 on the top electrode 22 can be carbon-based organics such as CxHy, CxHyNz, oxides such as SixOy, AlxOy, SiOxCy, high-k oxide, nitrides such as SixNy, SiOxNy, AlxNy, AlOxNy, amorphous or poly-Si, or their multi-stacked materials. In further embodiments, the hardmask material 24 can be a single film layer or multi-layer film with an oxide, a nitride, a Si, and an organic combined with any of the materials described herein. The materials 18, 20, 22 and 24 are patterned by conventional lithography and etching processes to form vertical pillars 26 with vertically aligned sidewalls. The vertical pillars 26 are in direct contact with the conductive wiring structures 12b.

Still referring to FIG. 1, a dielectric material 28 is deposited over the vertical pillars 26 and the etch stop layer or diffusion barrier layer 16. The dielectric material 28 can be an oxide material such as $SiO_2$, TEOS, FTEOS, low-k or ultra-low SiCOH, etc., or any combination of the same. The dielectric material 28 can be deposited by a conventional CVD, PECVD or ALD processes, followed by a planarization process. In embodiments, the planarization process can be a CMP or an etch back process. Alternatively, the dielectric material 28 may be applied by a spin-on and cure/dry process.

Figure 2:
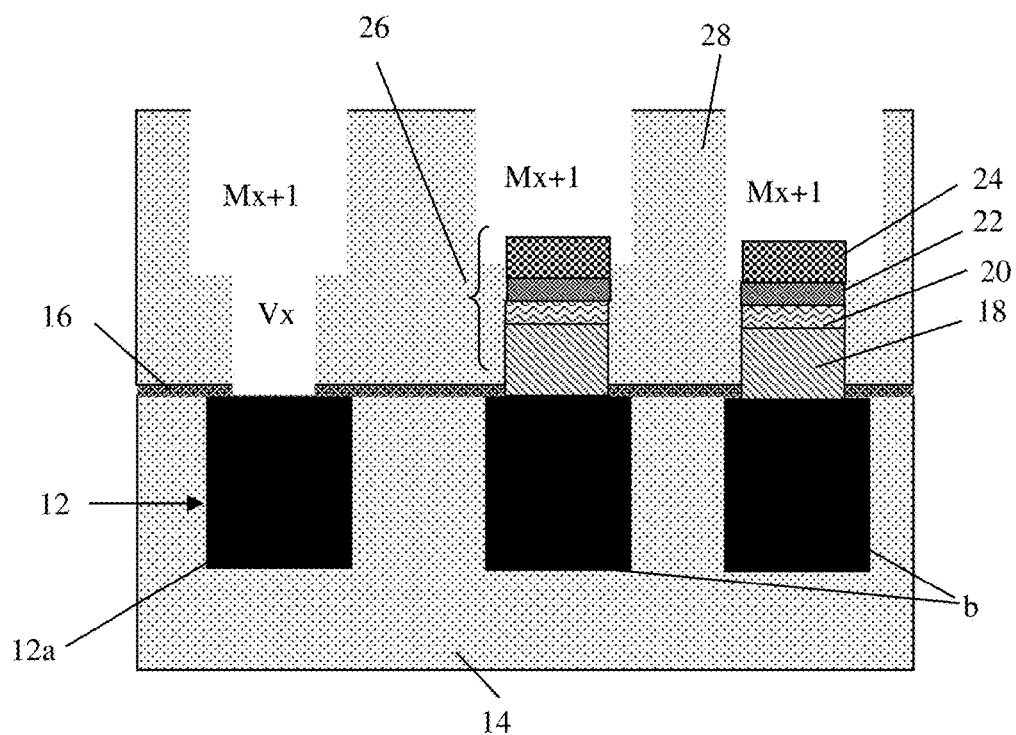
FIG. 2 shows a post damascene lithography and etch patterning for fabricating of trench and via structures in accordance with aspects of the present disclosure.

FIG. 2 shows a post damascene lithography and etch patterning process for fabricating a trench Mx+1 and via Vx. More specifically, in FIG. 2, the trench Mx+1 and via Vx can be formed using a dual damascene or multiple single damascene processes. In embodiments, the etch stop layer or diffusion barrier layer 16 can either be left or cleared in the via Vx before removal of the hardmask material 24. In embodiments, the etching process for the trench Mx+1 can be wider than the stack of material, e.g., vertical pillar 26, allowing for improved margins for a self-aligned feature. The via Vx will expose a surface of the conductive wiring structure 12a.

Figure 3:
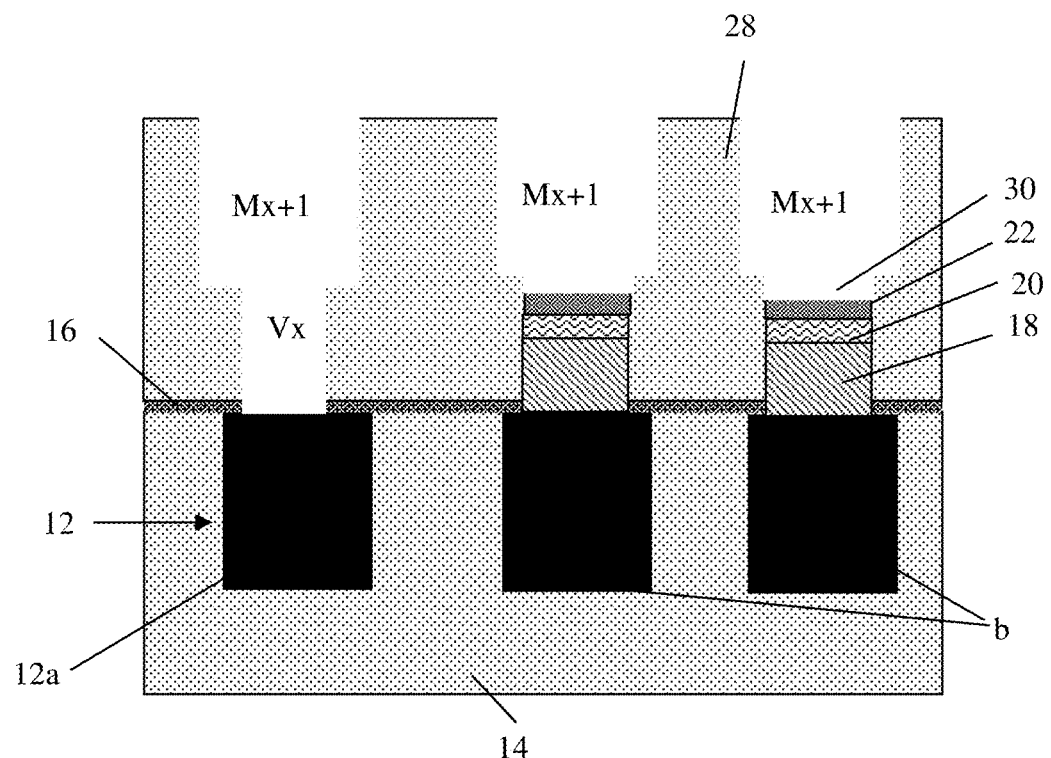
FIG. 3 shows a self-aligned via aligned with a top electrode, amongst other features, and respective fabrication processes in accordance with aspects of the present disclosure.

In FIG. 3, the hardmask material 24 is removed by a dry or wet etch process. The dry or wet etch process will be selective to the material of the hardmask material 24, thereby eliminating the need for any masking steps. The removal of the hardmask material 24 will create a self-aligned via 30, exposing the top electrode 22. In embodiments, the etch stop layer or diffusion barrier layer 16 can be removed during or post hardmask material removal. In either situation, the removal of the etch stop layer or diffusion barrier layer 16 will expose the surface of the conductive wiring structure 12a.

Figure 4:
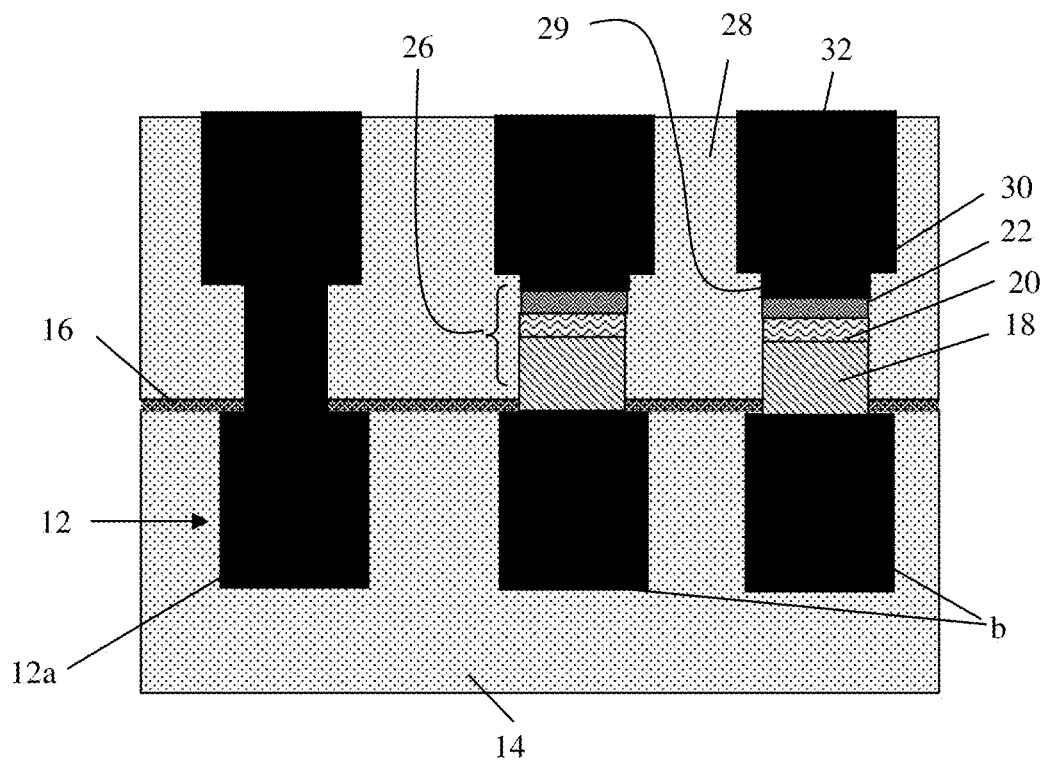
FIG. 4 shows a post metallization structure within the self-aligned via, amongst other features, and respective fabrication processes in accordance with aspects of the present disclosure.

FIG. 4 shows a post metallization structure and respective fabrication processes in accordance with aspects of the present disclosure. In embodiments, a conductive material 32 is deposited within the self-aligned via 30, the trench Mx+1 and the via Vx. The conductive material 32 within the self-aligned via 30 will be an interconnection 29 in direct electrical contact with the top electrode 22 and the upper metal, Mx+1. This can be accomplished without the need for extra masking steps. The interconnection 29 will have aligned vertical sidewalls with the vertical pillar structure 26. The metallization can use metals such as Cu, W, Al, Co, Ru, etc., in combination with diffusion barrier materials such as TiN, TaN, WN, etc., for interconnect and wiring structures. Following the metallization, e.g., deposition of metal and barrier material(s), a CMP process will be used to remove any excess materials.

Figure 5:
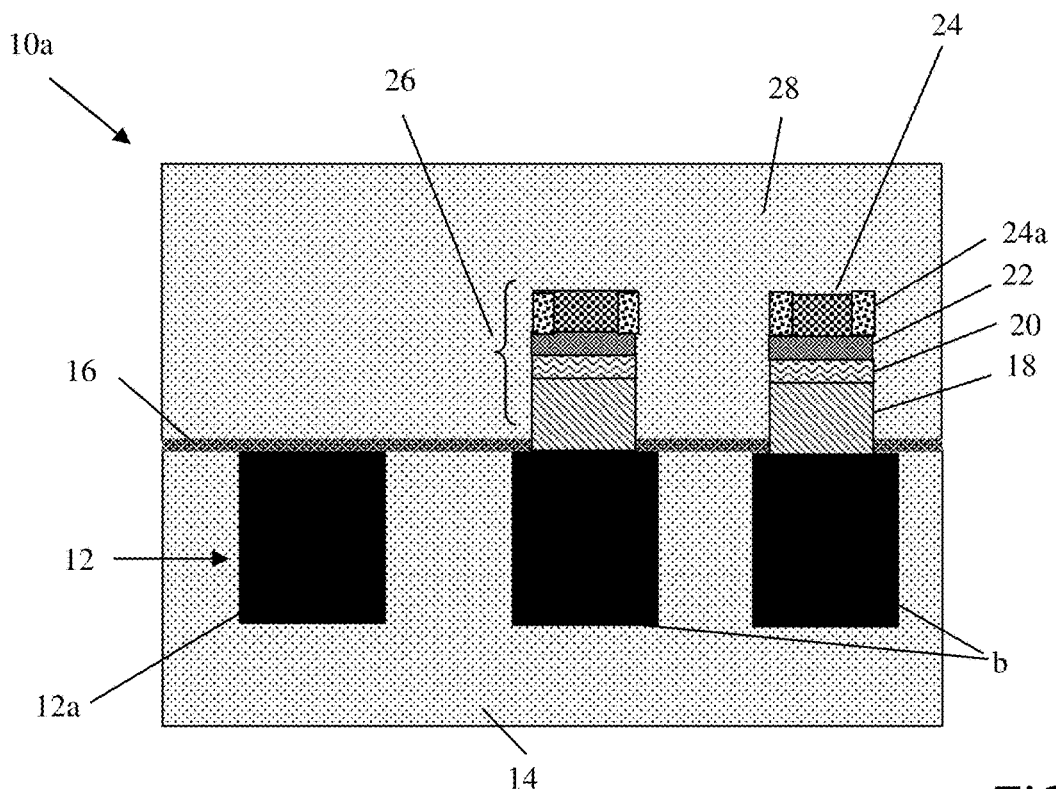
FIGS. 5 and 6 show an alternative structure with a spacer material defining the self-aligned via, and respective fabrication processes in accordance with an additional aspect of the present disclosure.
Figure 6:
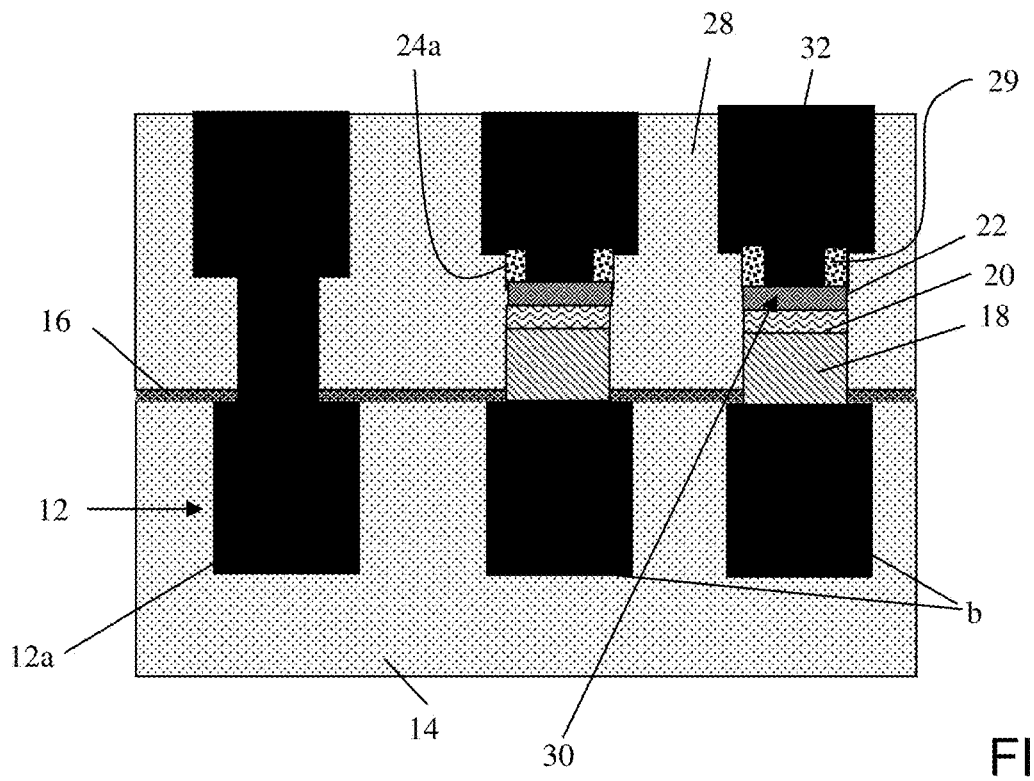

FIGS. 5 and 6 show an alternative structure with a spacer material and respective fabrication processes in accordance with an additional aspect of the present disclosure. In the structure 10a shown in FIG. 5, a spacer material 24a is provided on a sidewall of the hardmask material 24 on the vertical pillar 26. In embodiments, the spacer material 24a can be deposited after the hardmask material 24 is deposited and patterned by conventional deposition, lithography and etching processes. The spacer material 24a can be a nitride material such as SixNy, SiCxNy, AlxNy, SiOxNy, AlOxNy, etc., or an oxide material such as SiOx, SiOxCy, TiOx, AlOx, etc.

In FIG. 6, the trench Mx+1 and via Vx are formed using a dual damascene or multiple single damascene processes as described with respect to FIG. 2. The hardmask material 24 is removed by a dry or wet etch process as described with respect to FIG. 3. In this process, though, the spacer material 24a will not be removed, thereby defining (surrounding) the self-aligned via 30. In embodiments, the conductive material 32 is deposited within the self-aligned via 30, the trench Mx+1 and the via Vx as described in detail with respect to FIG. 4. In this embodiment, the interconnection 29 will have a stepped or narrower cross-section than the profile of the vertical pillar structure 26.

Figure 7:
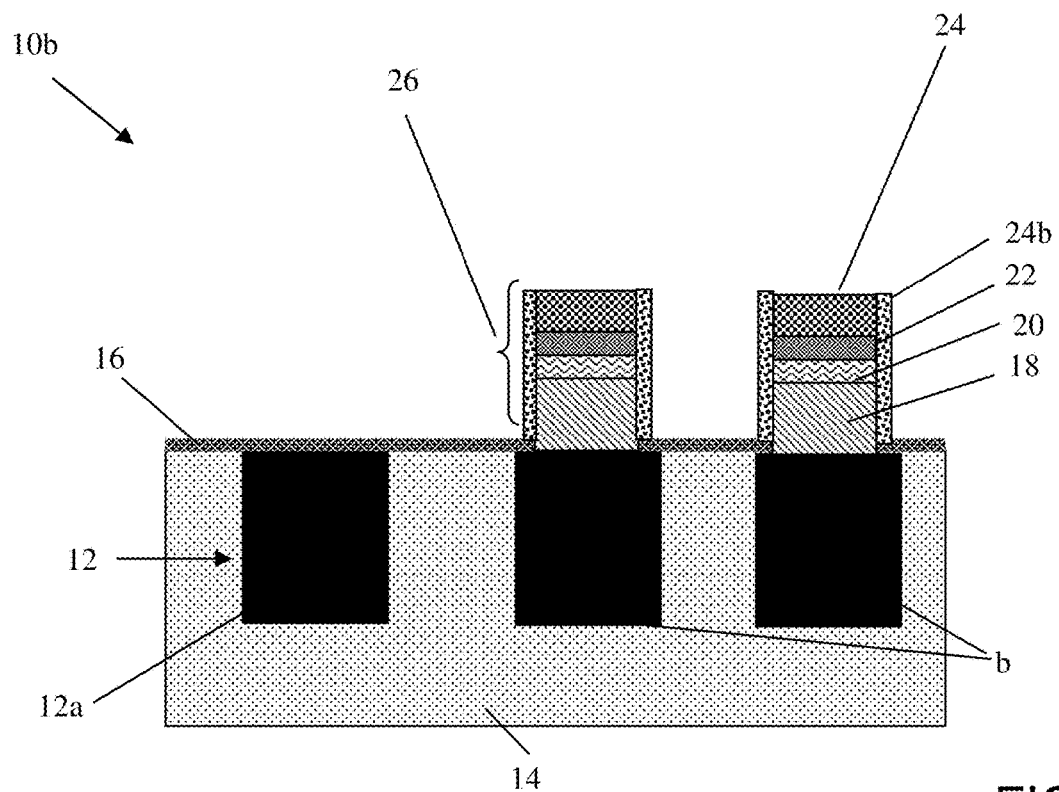
FIGS. 7 and 8 show an alternative structure with a liner material defining the self-aligned via, and respective fabrication processes in accordance with an additional aspect of the present disclosure.
Figure 8:
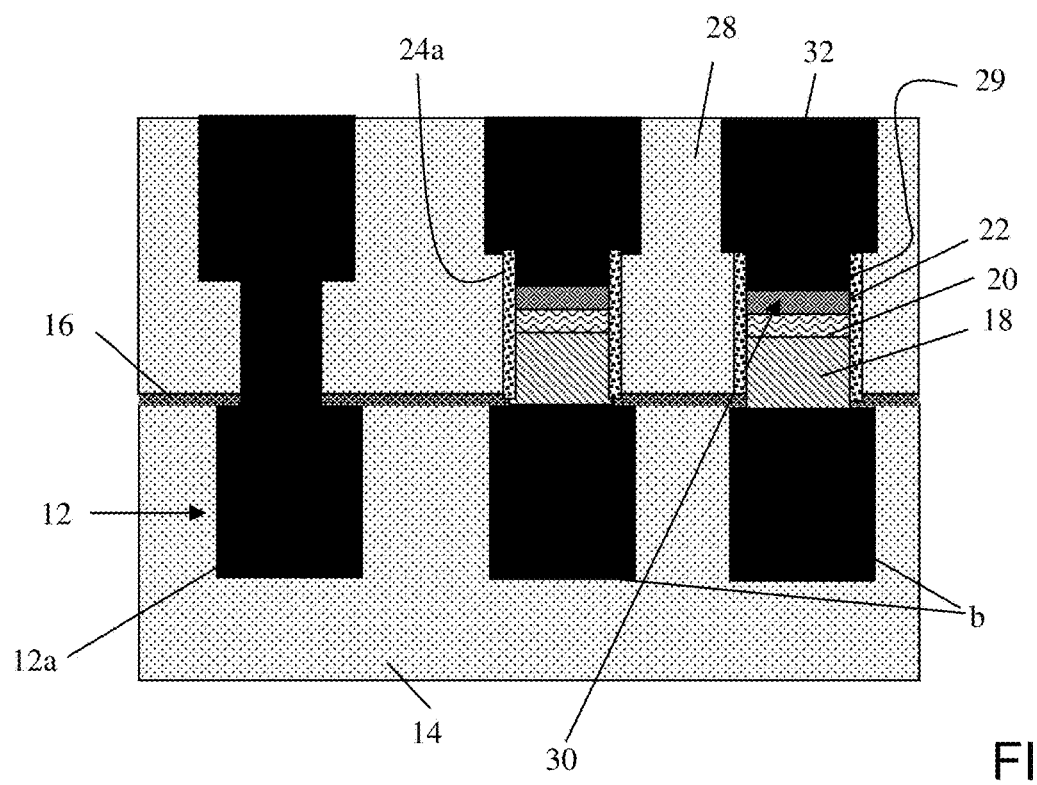

FIGS. 7 and 8 show an alternative structure with a liner material and respective fabrication processes in accordance with an additional aspect of the present disclosure. In the structure 10b shown in FIG. 7, a liner material 24b is provided on a sidewall of the entire vertical pillar 26, e.g., on materials 18, 20, 22, 24. In embodiments, the liner material 24b is deposited on the vertical pillar 26 by a conventional deposition process, e.g., CVD, to a thickness of about 1 nm to about 5 nm. The liner material 24b can be a nitride material such as SixNy, SiCxNy, AlxNy, SiOxNy, AlOxNy, etc., or an oxide material such as SiOx, SiOxCy, TiOx, AlOx, etc. After deposition of the liner material 24b, an anisotropic etching process is performed to remove the liner material 24b from horizontal surfaces of the structure 10a, e.g., over the hardmask material 24 and the etch stop layer or diffusion barrier layer 16.

In FIG. 8, the dielectric material 28 is deposited over the vertical pillar 26 (including the liner material 24b) and the etch stop layer or diffusion barrier layer 16 as described with respect to FIG. 1. The trench Mx+1 and via Vx are formed using a dual damascene or multiple single damascene processes as described with respect to FIG. 2. The hardmask material is removed by a dry or wet etch process as described with respect to FIG. 3. In this process, though, the liner material 24b will not be removed, thereby defining (surrounding) the self-aligned via 30. In embodiments, the conductive material 32 is deposited within the self-aligned via 30, the trench Mx+1 and the via Vx as described in detail with respect to FIG. 4. The interconnection 29 will have aligned vertical sidewalls with the vertical pillar structure 26.

Figure 9:
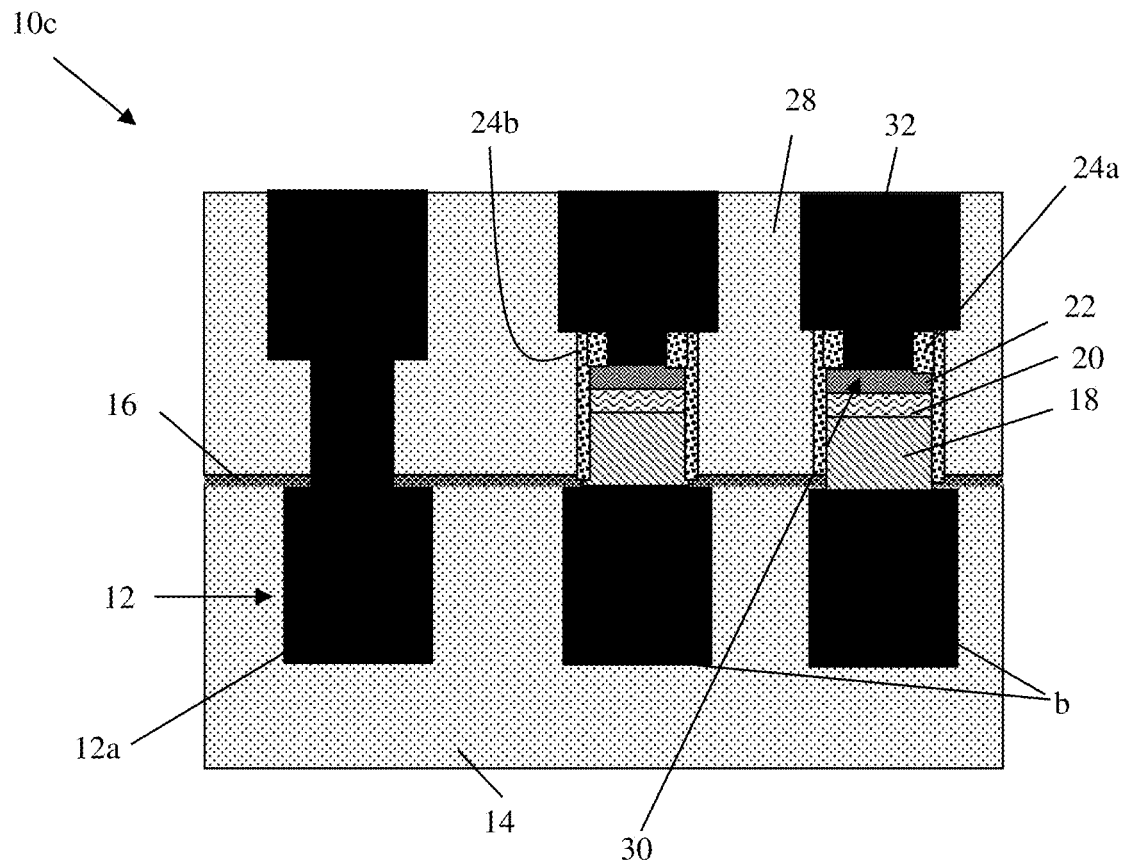
FIG. 9 shows another alternative structure with the spacer material and liner material defining the self-aligned via, and respective fabrication processes in accordance with an additional aspect of the present disclosure.

FIG. 9 shows an alternative structure 10c and respective fabrication processes in accordance with additional aspects of the present disclosure. In embodiments, the alternative structure 10c includes a double spacer defining the self-aligned via 30, i.e., the spacer material 24a and the liner material 24b. As should be understood by those of ordinary skill in the art, the fabrication processes for constructing the structure 10c of FIG. 9 is a combination of the structures and respective fabrication processes of FIGS. 5-8 such that no further explanation is required herein.

Figure 10:
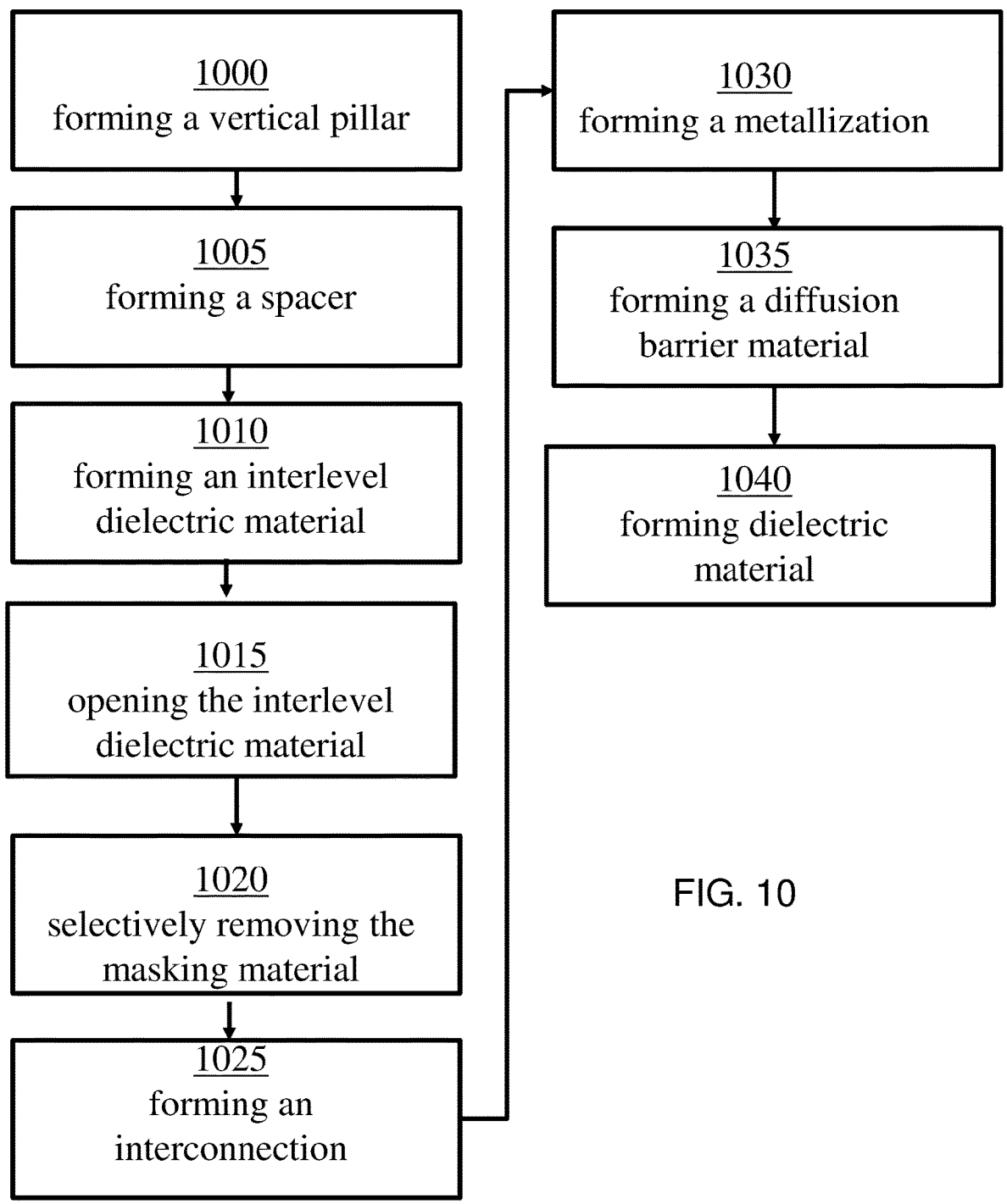
FIG. 10 shows flow chart of a fabrication process of manufacturing the structure of claim 1 in accordance with aspects of the present disclosure.

FIG. 10 shows flow chart of a fabrication process of manufacturing the structure of claim 1 in accordance with aspects of the present disclosure. Specifically, at step 1000, the process comprises forming a vertical pillar comprising a bottom electrode, one or more switching material, a top electrode and a masking material on the top electrode and further includes a via interconnection. At step 1005, the process comprises forming a spacer completely surrounding the via interconnection. At step 1010, the process comprises forming an interlevel dielectric material over the vertical pillar. At step 1015, the process comprises opening the interlevel dielectric material to expose the masking material. At step 1020, the process comprises selectively removing the masking material over the top electrode to form a self-aligned via interconnect. At step 1025, the process comprises forming an interconnection by deposited conductive material in the self-aligned via interconnect, which contacts the top electrode. At step 1030, the process comprises forming a metallization on the conductive material. At step 1035, the process comprises forming a diffusion barrier material directly contacting a top surface of a first metallization feature and directly contacting sidewalls of the bottom electrode. At step 1040, the process comprises forming dielectric material surrounding and directly contacting an outer sidewall surface of the spacer and sidewalls of each of the vertical pillar and a top surface of the diffusion barrier material.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming a vertical pillar comprising a bottom electrode, one or more switching material, a top electrode and a masking material on the top electrode and further includes a via interconnection;
    forming a spacer completely surrounding the via interconnection;
    forming an interlevel dielectric material over the vertical pillar;
    opening the interlevel dielectric material to expose the masking material;
    selectively removing the masking material over the top electrode to form a self-aligned via interconnect;
    forming an interconnection by deposited conductive material in the self-aligned via interconnect, which contacts the top electrode;
    forming a metallization on the conductive material;
    forming a diffusion barrier material directly contacting a top surface of a first metallization feature and directly contacting sidewalls of the bottom electrode; and
    forming dielectric material surrounding and directly contacting an outer sidewall surface of the spacer and sidewalls of each of the vertical pillar and a top surface of the diffusion barrier material.

2. The method of claim 1, wherein the hardmask material are carbon-based organics, oxides, nitrides, amorphous or poly-Si, or combinations thereof.

3. The method of claim 1, further comprising at least one of a spacer and liner on the masking material, prior to removal and, upon removal, the at least one spacer and the liner defines the self-aligned via interconnect.

4. The method of claim 1, wherein the spacer completely surrounds the via interconnection, the one or more switching material below the top electrode and devoid of the spacer, and the bottom electrode between a bottom surface of the one or more switching material and a top surface of the first metallization feature and being devoid of the spacer.

5. The method of claim 4, wherein:
    an outer sidewall surface of the spacer and an edge of the top electrode have coplanar sidewalls,
    the spacer extends only within a space defined by the top electrode and a bottom surface of a second metallization layer, and
    the diffusion barrier material is a different material than the dielectric material.

6. The method of claim 4, further comprising forming a lower metallization feature and an upper metallization feature connected together by an interconnect structure devoid of any intervening materials.

7. The method of claim 4, wherein the bottom electrode, the one or more switching materials, the top electrode and the spacer material surrounding the via interconnection have vertically aligned sidewalls forming the vertical pillar.

8. A method, comprising:
    forming a lower metallization feature;
    forming an upper metallization feature;
    forming a bottom electrode in direct contact with the lower metallization feature;
    forming one or more switching materials over the bottom electrode;
    forming a top electrode over the one or more switching materials;
    forming a via interconnection in contact with the top electrode and the upper metallization feature;
    forming a spacer material only contacting and surrounding a sidewall of the via interconnection, and contacting a top surface of the top electrode and a bottom surface of the upper metallization feature;
    forming dielectric material surrounding and contacting an outer sidewall surface of the spacer material and directly contacting sidewalls of each of the one or more switching materials; and
    forming a diffusion barrier material contacting directly with a top surface of the lower metallization feature and sidewalls of the bottom electrode, the diffusion barrier material being different material than the dielectric material,
    wherein sidewalls of each of the bottom electrode, the one or more switching materials, the top electrode and an outer surface of the spacer material are coplanar with one another, and with the via interconnection form a vertical pillar structure and the dielectric material directly contacting the sidewalls of the bottom electrode, the sidewalls of the top electrode and an entire top surface of the diffusion barrier material.

9. The method of claim 8, wherein the via interconnection is a self-aligned via interconnection, the top electrode is in direct contact with the one or more switching materials.

10. The method of claim 8, wherein the lower metallization feature and the upper metallization feature are connected together by an interconnect structure devoid of any intervening materials.

11. A method, comprising:
    forming a first metallization layer;
    forming a second metallization layer;
    forming a vertical pillar connecting the first metallization layer to the second metallization layer, the vertical pillar including an aligned via interconnection and a spacer completely surrounding the aligned via interconnection and both being in direct contact with a top electrode of the vertical pillar and a bottom surface of the second metallization layer, the vertical pillar further comprising a switching material below the top electrode and which is devoid of the spacer, and a bottom electrode between a bottom surface of the switching material and a top surface of the first metallization feature and which is also devoid of the spacer;
    forming the lower metallization feature and the upper metallization feature connected together by an interconnect structure devoid of the aligned via interconnection and the vertical pillar;
    forming a diffusion barrier material directly contacting a top surface of the first metallization layer and directly contacting sidewalls of the bottom electrode;
    forming dielectric material surrounding and directly contacting an outer sidewall surface of the spacer and sidewalls of each of the vertical pillar and a top surface of the diffusion barrier material,
    wherein an outer sidewall surface of the spacer and an edge of the top electrode have coplanar sidewalls,
    wherein the spacer extends only within a space defined by the top electrode of the vertical pillar and the bottom surface of the second metallization layer, and
    wherein the diffusion barrier material is a different material than the dielectric material.

12. The method of claim 11, wherein the self-aligned via interconnection is in a via which exposes the top electrode and further comprising a sidewall structure contacting the spacer, a sidewall of the vertical pillar and the diffusion barrier material.

13. The method of claim 12, wherein the spacer defines the self-forming self-aligned via and completely surrounds and is in direct contact with the self-aligned via interconnection and a sidewall structure, and the sidewall structure being in direct contact with an outer surface of the vertical pillar.

14. The method of claim 13, wherein the vertical pillar has a narrower cross-section at the self-forming self-aligned via compared to the top electrode.

* * * * *